(12) United States Patent
Horng

(10) Patent No.: US 6,282,091 B1
(45) Date of Patent: Aug. 28, 2001

(54) MOUNTING DEVICES FOR A HEAT-GENERATING ELEMENT AND A HEAT-DISSIPATING DEVICE

(75) Inventor: Alex Horng, Kaohsiung (TW)

(73) Assignee: Sunonwealth Electric Machine Industry Co. Ltd, Kaohsiung (TW)

( * ) Notice: Subject to any disclaimer, the term of this patent is extended or adjusted under 35 U.S.C. 154(b) by 0 days.

(21) Appl. No.: 09/559,078

(22) Filed: Apr. 27, 2000

(30) Foreign Application Priority Data

Nov. 11, 1999 (TW) ............................................ 88219446 U
Nov. 24, 1999 (TW) ............................................ 88220121 U (51) Int. Cl.[7] ................................................... H05K 7/20
(52) U.S. Cl. ............................ 361/697; 165/121; 361/719; 454/184
(58) Field of Search ........................ 174/16.3; 257/722; 165/80.3, 185, 121–126; 454/184; 312/236; 415/177, 178, 213.1, 214.1; 361/695, 697, 703, 704, 710, 720, 717–719

(56) References Cited

U.S. PATENT DOCUMENTS

| 5,734,553 | * | 3/1998 | Hong | 361/697 |
| 5,873,406 | * | 2/1999 | Horng | 165/80.3 |
| 5,880,930 | * | 3/1999 | Wheaton | 361/690 |
| 5,940,269 | * | 8/1999 | Ko et al. | 361/697 |
| 6,037,660 | * | 3/2000 | Liu | 257/722 |
| 6,053,242 | * | 4/2000 | Hsieh | 165/121 |
| 6,105,215 | * | 8/2000 | Lee | 24/248 |
| 6,157,539 | * | 12/2000 | Wagner et al. | 361/704 |

FOREIGN PATENT DOCUMENTS 346211   11/1998   (TW) .

* cited by examiner

Primary Examiner—Gerald Tolin
(74) Attorney, Agent, or Firm—Bacon & Thomas, PLLC (57) ABSTRACT

A number of posts are formed on an underside of a cover plate of a heat-dissipating device. The posts are extended through positioning holes on a base of the heat-dissipating device. The posts may have snap fasteners that are extended through positioning holes in a circuit board on which a heat-generating element is mounted. Alternatively, each post is extended through an engaging member that has an engaging peg projected therefrom. Each engaging peg has a snap fastener for engaging with an associated positioning hole of the circuit board. An elastic element is sleeved around each post or each engaging peg, thereby providing the snap fastener with reliable snapping effect. Thus, the base of the heat-dissipating device and the heat-generating element are in intimate contact with each other to obtain excellent heat conduction therebetween.

9 Claims, 10 Drawing Sheets

MOUNTING DEVICES FOR A HEAT-GENERATING ELEMENT AND A HEAT-DISSIPATING DEVICE

BACKGROUND OF THE INVENTION

1. Field of the Invention

The present invention relates to mounting devices for a heat-generating element (e.g., a central processing unit) and a heat-dissipating device, and more particularly to mounting devices that can be easily and securely engaged with the heat-generating element to obtain a minimized thickness after assembly, thereby obtaining an optimal heat-dissipating effect.

2. Description of the Related Art

Taiwan Utility Model Publication No. 346211 issued on Nov. 21, 1998 and entitled "IMPROVED STRUCTURE FOR HEAT-DISSIPATING DEVICES" discloses a heat-dissipating plate, a fan, and a holding member for fixing the fan and for maintaining a gap between the fan and the heat-dissipating plate. A retainer is provided to be engaged with the heat-dissipating plate by bolts and nuts and to retain the central processing unit in place. Thus, the heat-dissipating plate may be securely engaged with the central processing unit. Nevertheless, the retainer has a certain thickness and thus fails to obtain a minimized thickness, as the heat-dissipating device after assembly is elevated above the surface of the circuit board by an increased height that is equal to the thickness of the retainer.

SUMMARY OF THE INVENTION

It is a primary object of the present invention to provide a mounting device for the heat-generating element and the heat-dissipating device. The mounting device is simple in structure and easy to manufacture, and the heat-dissipating device is elevated by a lower level after assembly, thereby providing an optimal heat-dissipating effect.

In accordance with the present invention, a number of posts are formed on an underside of a cover plate of a heat-dissipating device. The posts are extended through positioning holes on a base of the heat-dissipating device. The posts may have snap fasteners that are extended through positioning holes in a circuit board on which a heat-generating element is mounted. Alternatively, each post is extended through an engaging member that has an engaging peg projected therefrom. Each engaging peg has a snap fastener for engaging with an associated positioning hole of the circuit board. An elastic element is sleeved around each post or each engaging peg, thereby providing the snap fastener with reliable snapping effect. Thus, the base of the heat-dissipating device and the heat-generating element are tightly contact with each other to obtain excellent heat conduction therebetween.

Other objects, specific advantages, and novel features of the invention will become more apparent from the following detailed description and preferable embodiments when taken in conjunction with the accompanying drawings.

DETAILED DESCRIPTION OF THE PREFERRED EMBODIMENTS

Preferred embodiments in accordance with the present invention will now be described with reference to the accompanying drawings.

Figure 1:
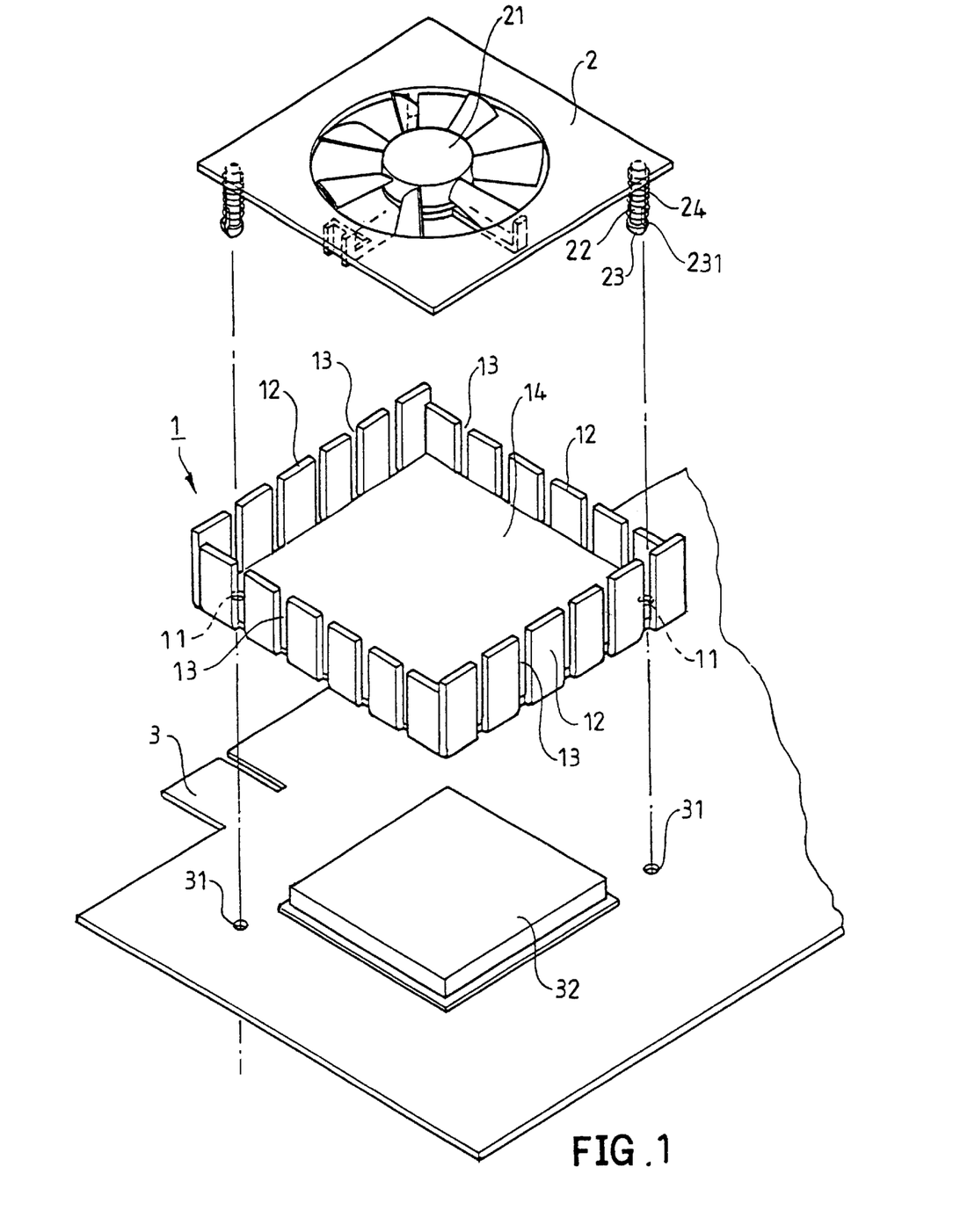
FIG. 1 is an exploded perspective view of a heat-dissipating device, a circuit board, and a first embodiment of a mounting device in accordance with the present invention.

Referring to FIG. 1, a heat-dissipating device in accordance with the present invention generally includes a base 1 and a cover plate 2. The base 1 is made of metal of excellent thermal conductivity. The base 1 has a flat underside to be in intimate contact with a heat-generating element 32 that is mounted on a circuit board 3. The base 1 includes a number of positioning holes 11 that are respectively aligned with positioning holes 31 defined in the circuit board 3. The base 1 includes a plurality of upright fins 12, wherein each two adjacent fins 12 have a passage 13 therebetween to allow air to flow therethrough, thereby providing a better heat-dissipating effect. The fins 12 may by formed along a periphery of the base 1, thereby defining a central compartment 14 for receiving a fan impeller 21 pivotally mounted under the cover plate 2. In order to have a lower height (smaller thickness) and better positioning effect, the fins 12 formed on two opposite sides of the base 1 are of a height lower than the fins 12 formed on the other two opposite sides of the base 1. Thus, the cover plate 2 may rest on tops of the lower fins 12 and two opposite sides of the cover plate 2 are held between the higher fins 12.

Figure 3:
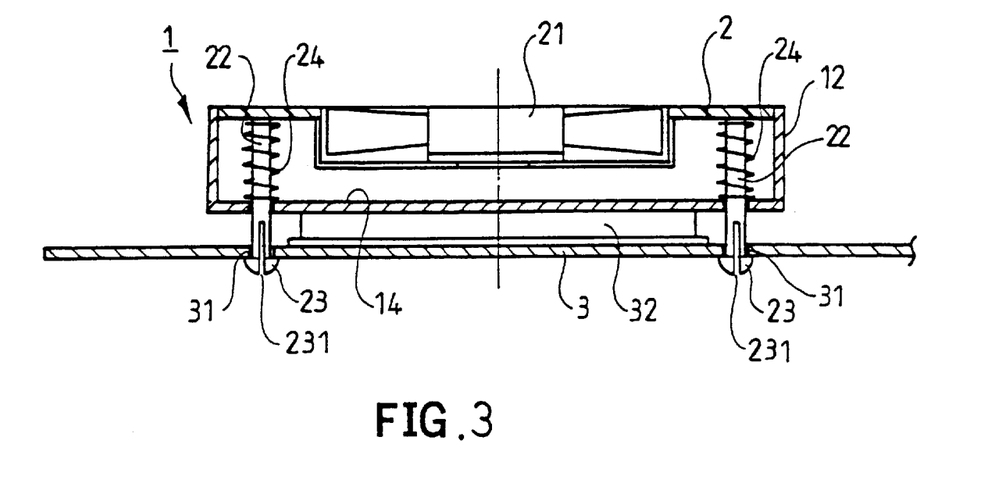
FIG. 3 is a sectional view taken along line 3—3 in FIG. 2.

The cover plate 2 includes a number of downwardly extending posts 22, each post 22 having a snap fastener 23 on a lower distal end thereof. As illustrated in FIGS. 1 and 3, the snap fastener 23 of each post 22 has a longitudinal slit 231 to provide the snap fastener with required resiliency for compression and expansion in a radial direction when the snap fastener is passed through a positioning hole 11 or 31. Thus, the snap fastener 23 is compressed when passing through a positioning hole 11 or 31 and then expands to its initial shape and retains on an underside of the circuit board 3 after passing through the positioning hole 31. An elastic element 24 is sleeved around each post 22 in which an end of the elastic element 24 is pushing to the cover plate 2 and the other end of the elastic element 24 is pushing to the base 1 for forcing the cover plate 2 away from the base 1 to thereby securely engaging the heat-dissipating device onto the circuit board 3 by the posts 22 of the cover plate 2. The fan impeller 21 may be mounted under the cover plate 2 to drive air to flow, thereby providing the base 1 with better heat-dissipating effect.

Figure 2:
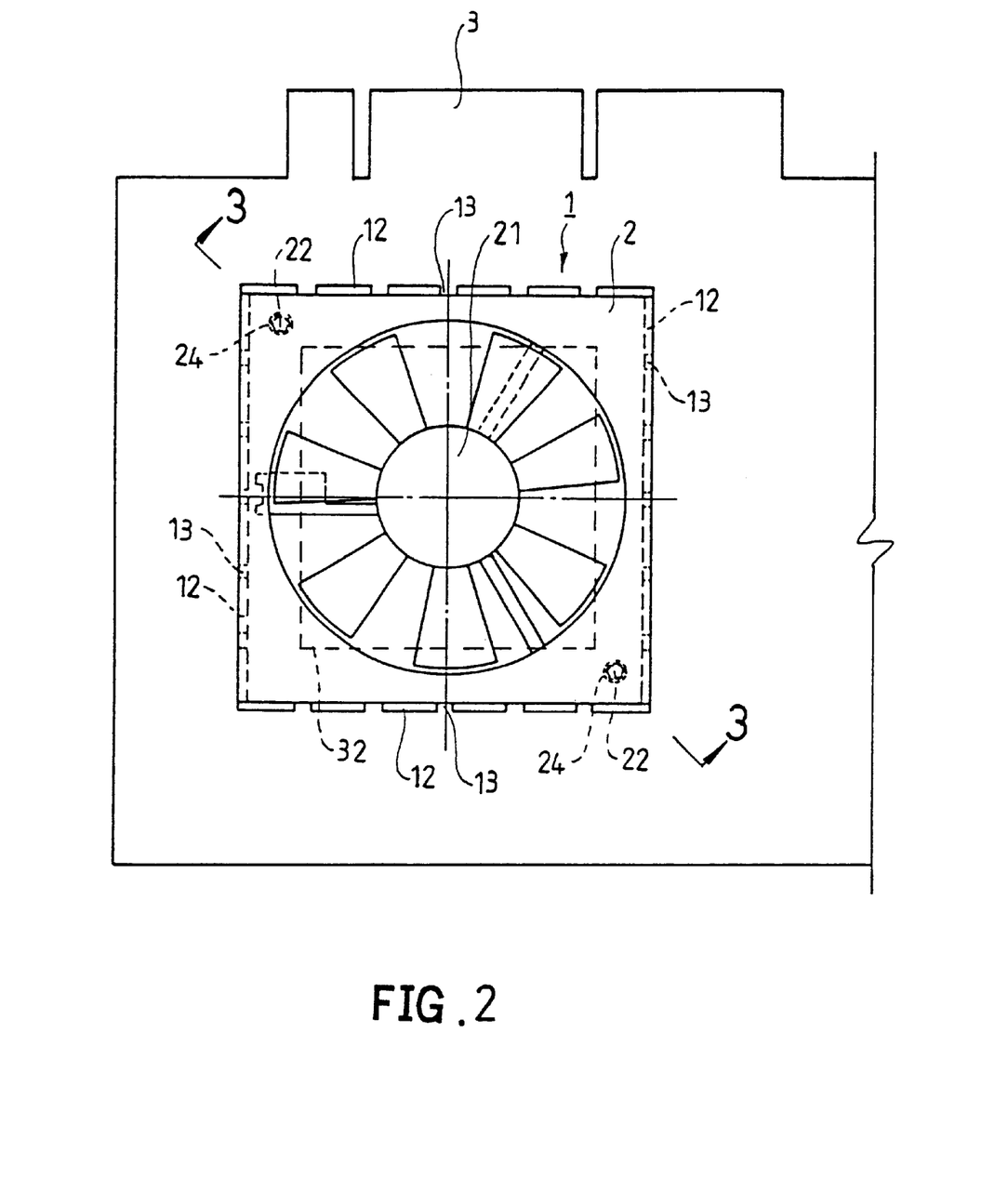
FIG. 2 is a top view of the heat-dissipating device, the circuit board, and the mounting device in FIG. 1.

FIGS. 2 and 3 show assembly between the heat-dissipating device and the circuit board. The cover plate 2 and the base 1 are engaged with each other by the posts 22 of the cover plate 2 extending through the positioning holes 11 and 31 of the base 1 and the circuit board 3, respectively. The snap fasteners 23 are retained on the other side of the positioning holes 31, as mentioned above, thereby obtaining reliable engagement.

Figure 4:
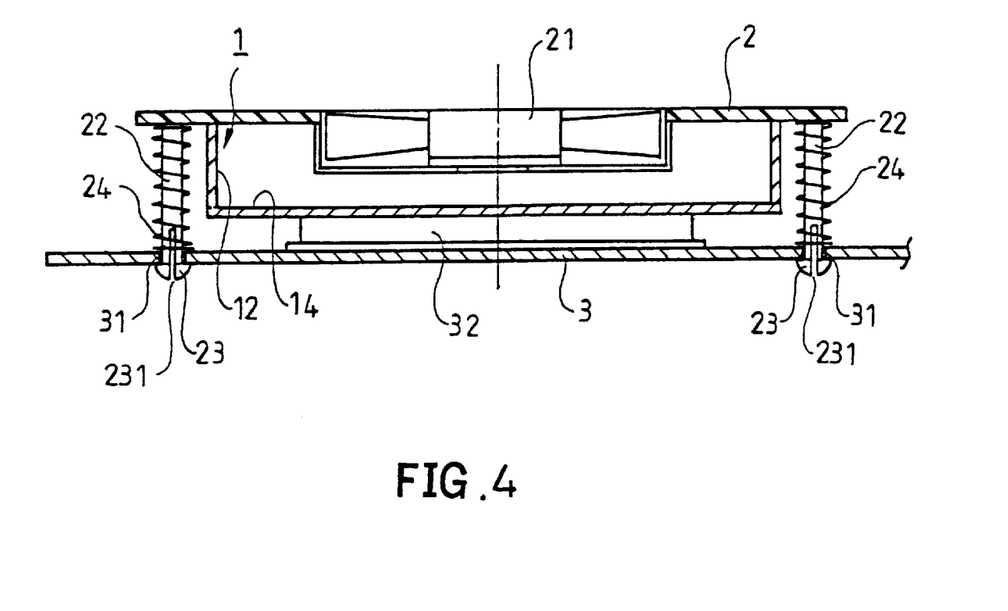
FIG. 4 is a sectional view similar to FIG. 3, illustrating a second embodiment of the mounting device in accordance with the present invention.

FIG. 4 illustrates a second embodiment of the invention, wherein the cover plate 2 has an area larger than that of the base 1, and the posts 22 of the cover plate 2 of the heat-dissipating device are not extended through the base 1. Instead, the posts 22 of the cover plate 2 are directly extended through the positioning holes 31 of the circuit board 3, thereby providing a reliable engagement in an easier manner.

Figure 5:
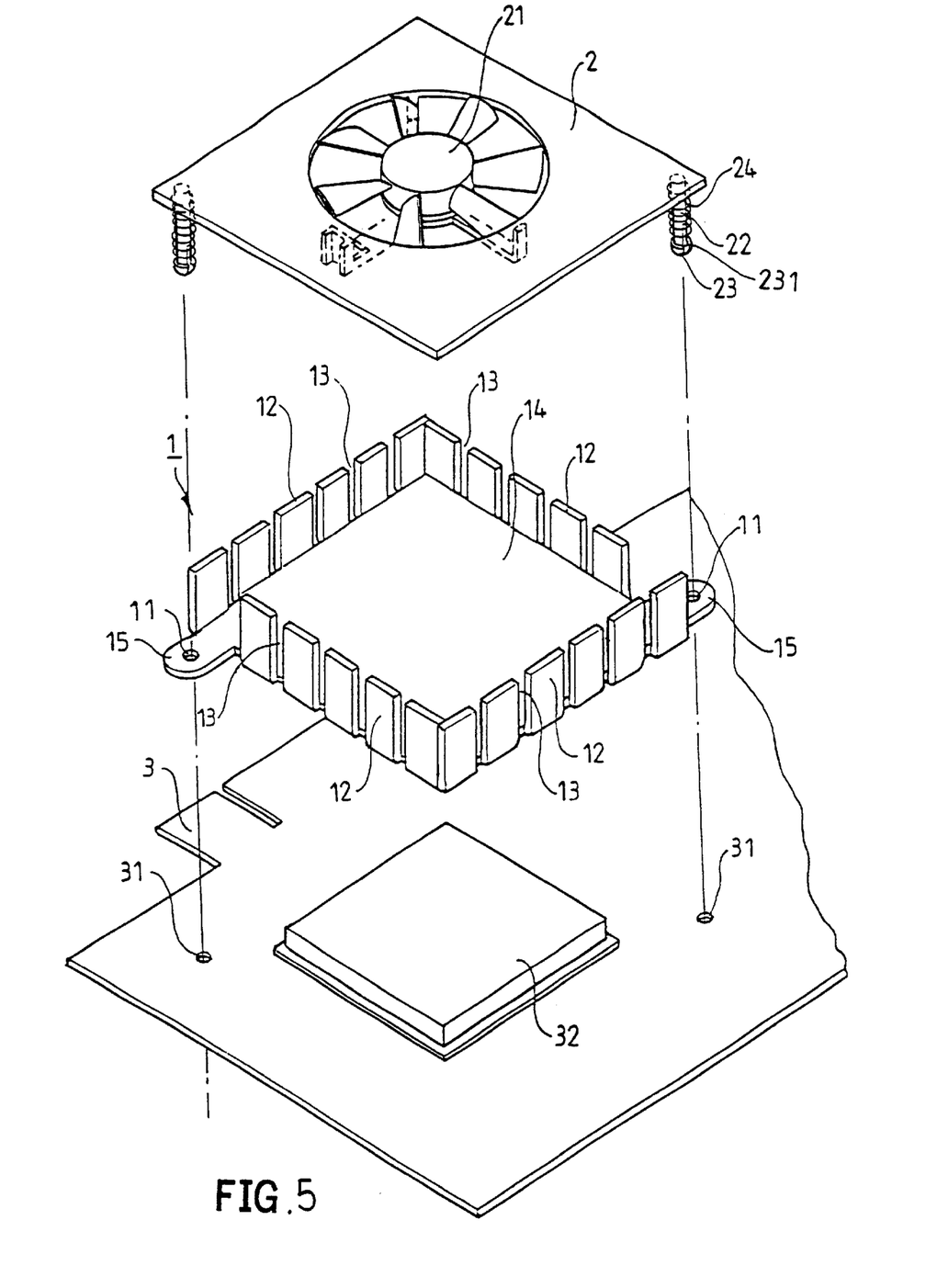
FIG. 5 is an exploded perspective view of a heat-dissipating device, a circuit board, and a third embodiment of the mounting device in accordance with the present invention.
Figure 6:
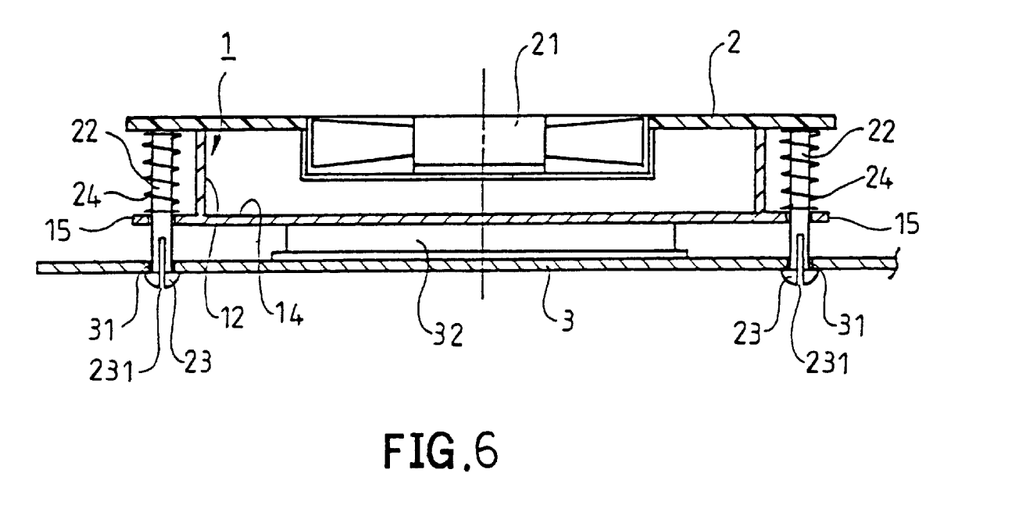
FIG. 6 is a sectional view of the heat-dissipating device, the circuit board, and the mounting device if FIG. 5.

FIGS. 5 and 6 illustrate a third embodiment of the invention, wherein the base 1 includes a number of outwardly extending positioning tabs 15. Each positioning tab 15 includes a positioning hole 11 through which an associated post 22 of the cover plate 2 extends. As mentioned above, the each post 22 has a snap fastener 23 that is retained on the other side of an associated positioning hole 31 of the circuit board 3. Thus, the heat-dissipating device is securely and easily engaged with the heat-generating element 32 in an intimate contact manner.

Figure 7:
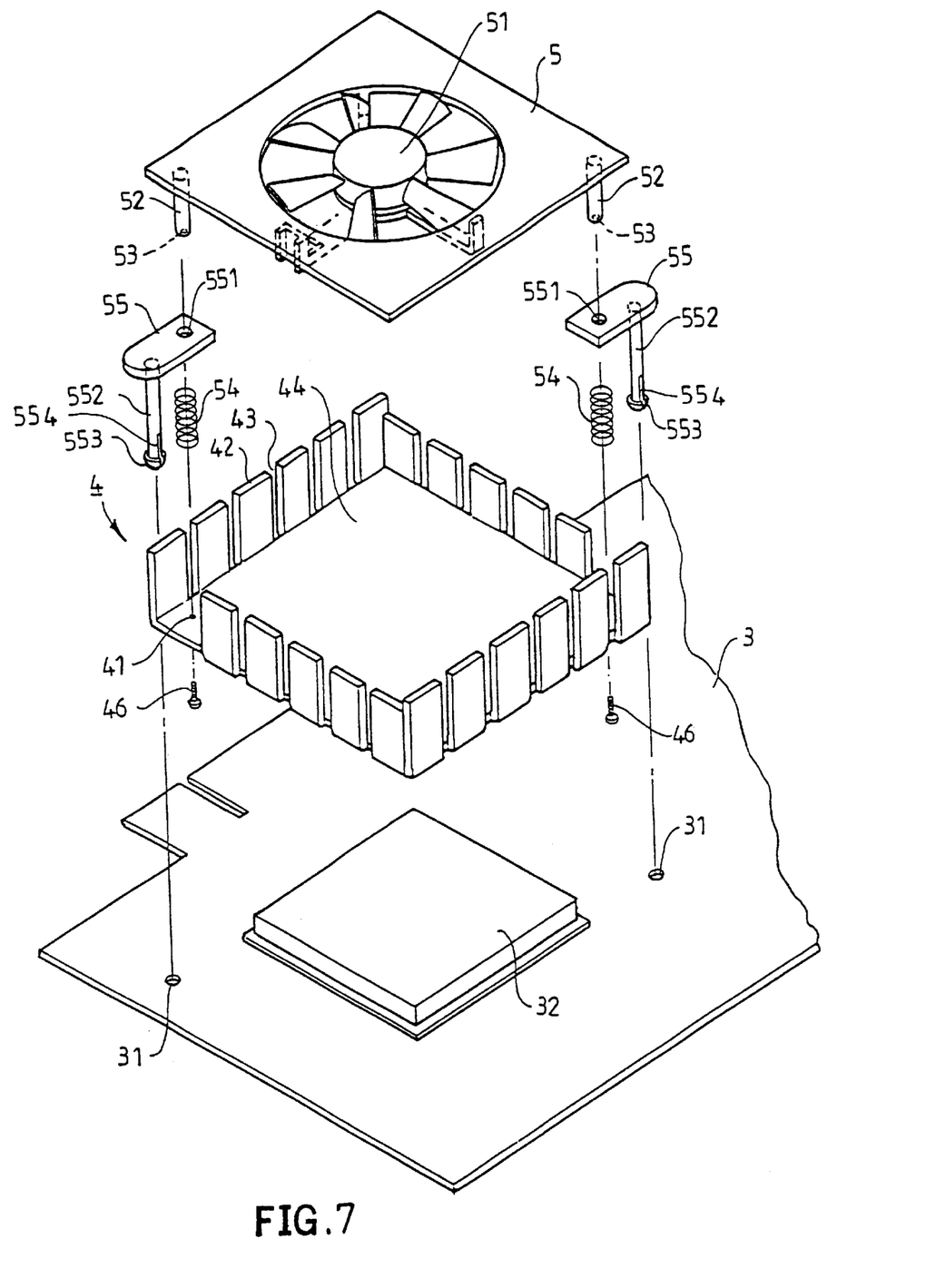
FIG. 7 is an exploded perspective view of a heat-dissipating device, a circuit board, and a fourth embodiment of the mounting device in accordance with the present invention.

FIG. 7 illustrates a fourth embodiment of the invention. The base 4 is made of metal of excellent thermal conductivity. The base 4 has a flat underside to be in intimate contact with a heat-generating element 32 that is mounted on a circuit board 3. The base 4 includes a number of positioning holes 41 through which a fastener 46 (such as a bolt or screw) is extended for engaging with the cover plate 5, which will be described later. The base 4 includes a plurality of upright fins 42, wherein each two adjacent fins 42 have a passage 43 therebetween to allow air to flow therethrough, thereby providing a better heat-dissipating effect. The fins 42 may be formed along a periphery of the base 4, thereby defining a central compartment 44 for receiving a fan impeller 51 pivotally mounted under the cover plate 5. In order to have a lower height and better positioning effect, the fins 42 formed on two opposite sides of the base 4 are of a height lower than the fins 42 formed on the other two opposite sides of the base 4. Thus, the cover plate 5 may rest on tops of the lower fins 42 and two opposite sides of the cover plate 5 are held between the higher fins 42.

Figure 9:
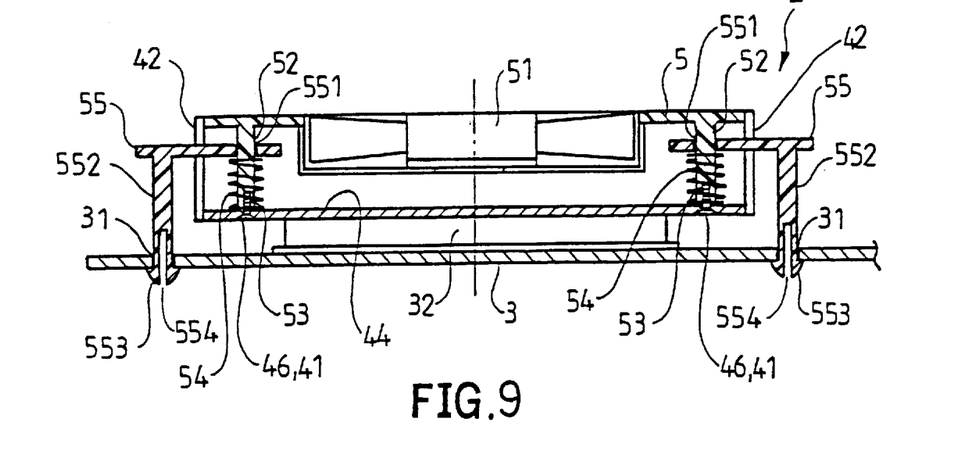
FIG. 9 is a sectional view taken along line 9—9 in FIG. 8.

The cover plate 5 includes a number of downwardly extending posts 52, each post 52 having a positioning hole 53 in a lower distal end thereof for engaging with a fastener 46 (such as a bolt or screw) that extends through an associated positioning hole 41 of the base 4, thereby securely engaging the cover plate 5 and the base 4 together. A number of engaging members 55 are provided and each includes a positioning hole 551 through which an associated post 52 is extended. Each engaging member 55 further includes an engaging peg 552 with a snap fastener 553 on a lower distal end thereof. As illustrated in FIGS. 7 and 9, the snap fastener 553 of each engaging peg 552 has a longitudinal slit 554 to provide the snap fastener 553 with required resiliency for compression and expansion in a radial direction when the snap fastener is passed through a positioning hole 31. Thus, the snap fastener 553 is compressed when passing through a positioning hole 31 and then expands to its initial shape and retains on an underside of the circuit board 3 after passing through the positioning hole 31. An elastic element 54 is mounted around each post 52 or engaging peg 552, thereby providing the snap fastener 553 of the engaging member 55 with better positioning effect. Again, the fan impeller 51 may be mounted under cover plate 5 to drive air to flow, thereby providing the base 4 with better heat-dissipating effect.

Figure 8:
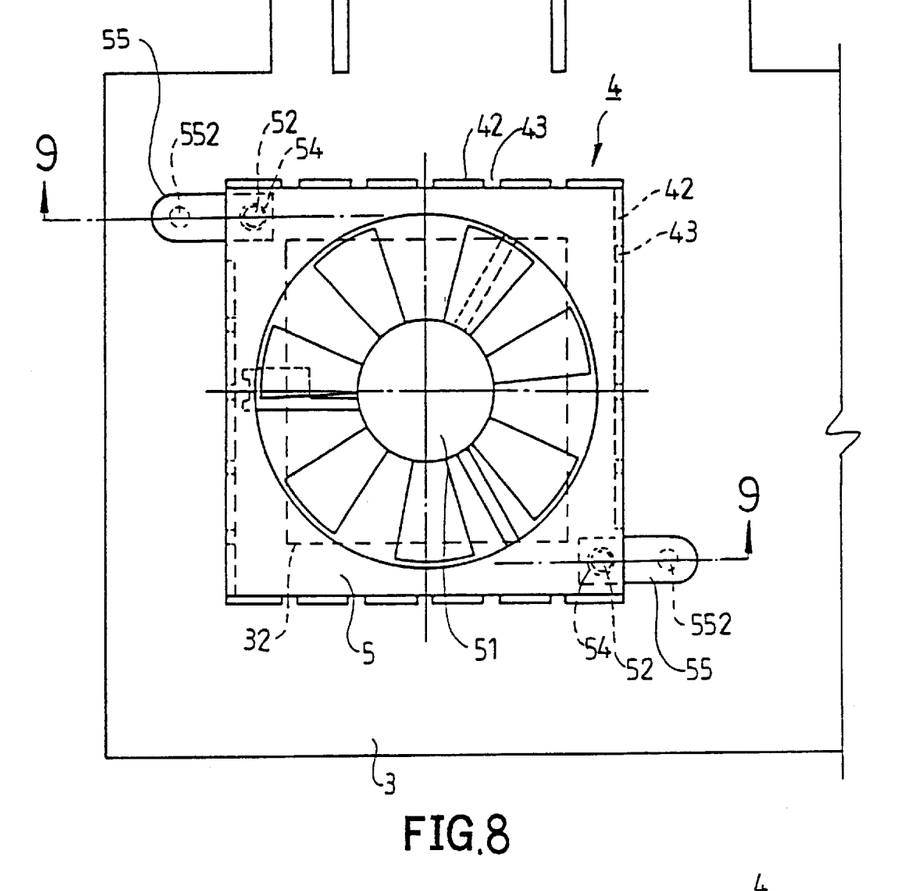
FIG. 8 is a top view of the heat-dissipating device, the circuit board, and the mounting device in FIG. 7.

FIGS. 8 and 9 show assembly between the heat-dissipating device and the circuit board.

The cover plate 5 and the base 4 are engaged with each other by the engaging peg 552 of each engaging member 55 extending through the positioning holes 31 of the circuit board 3. The snap fasteners 553 are retained on the other side of the positioning holes 31, as mentioned above, thereby obtaining reliable engagement.

Figure 10:
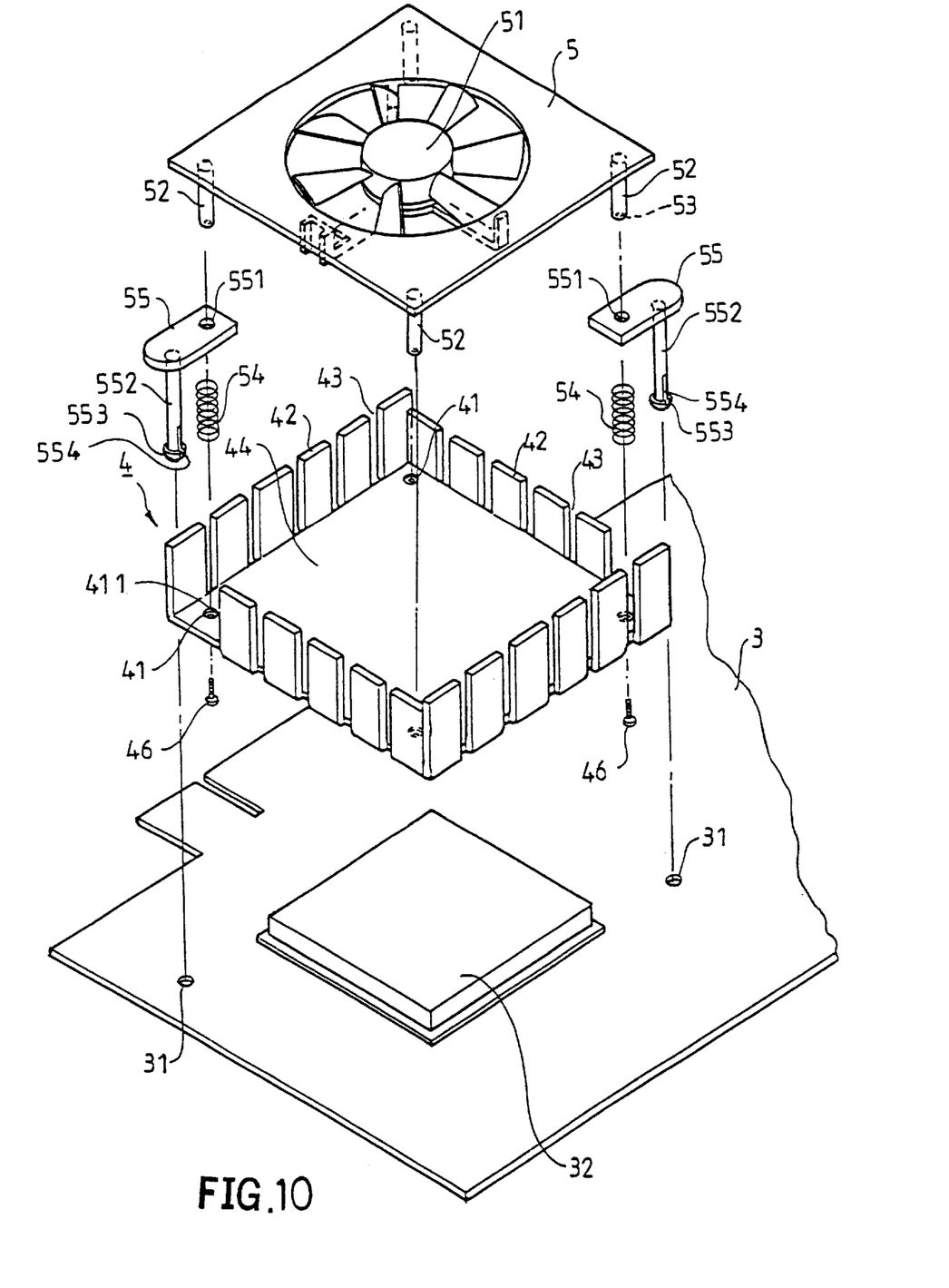
FIG. 10 is an exploded perspective view of a heat-dissipating device, a circuit board, and a fifth embodiment of the mounting device in accordance with the present invention.

FIG. 10 illustrates a fifth embodiment of the invention, wherein the base 4 and the cover plate 5 have more positioning holes 41 and more posts 52. Each positioning hole 41 may have a countersink 411 to receive a lower end of an associated post 52, thereby providing a more reliable engagement. It is noted that only two posts 52 are provided with the engaging members 55 without adversely affecting the reliable engagement between the base 4 and the cover plate 5.

Figure 11:
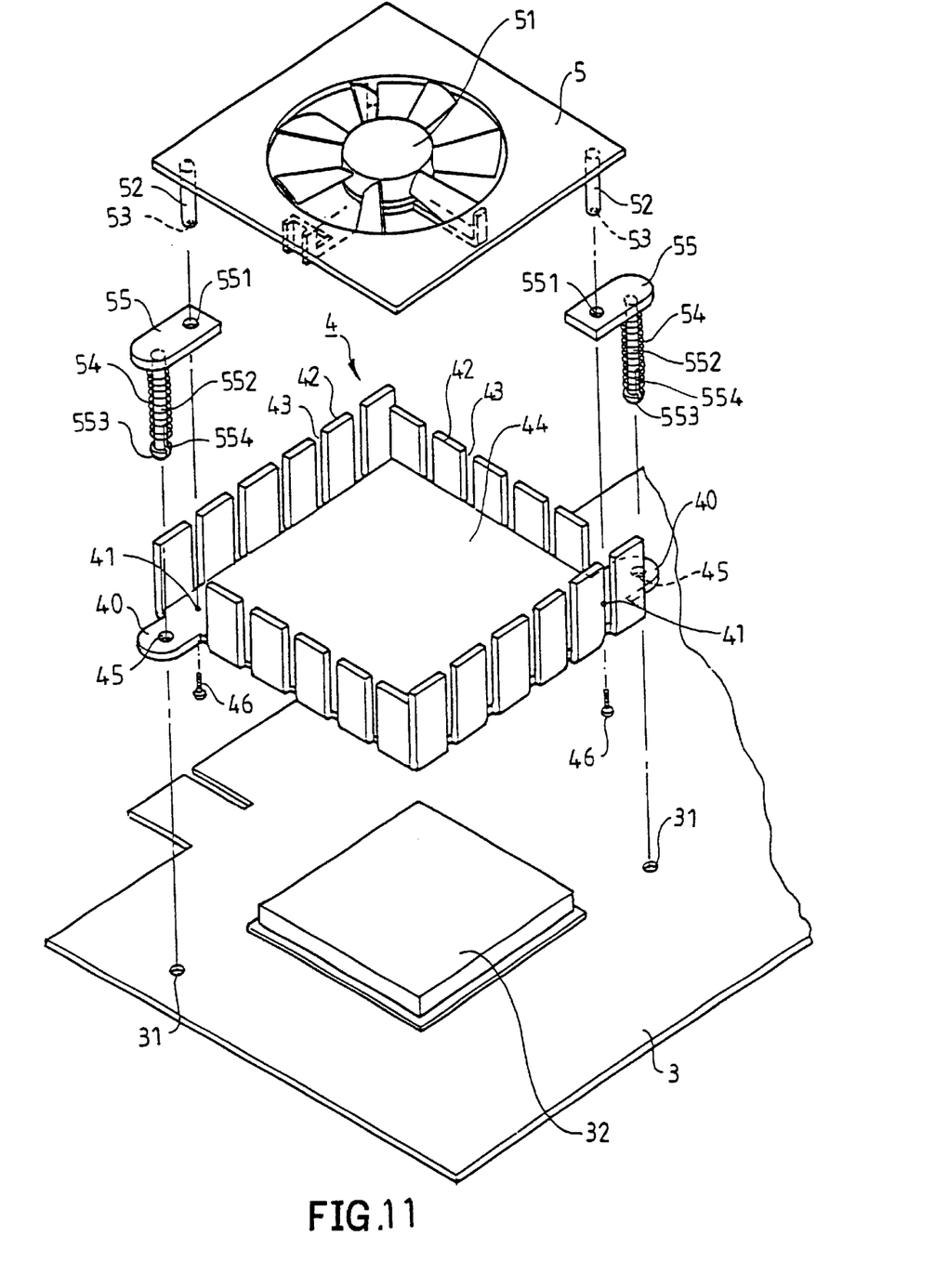
FIG. 11 is an exploded perspective view of a heat-dissipating device, a circuit board, and a sixth embodiment of the mounting device in accordance with the present invention.
Figure 12:
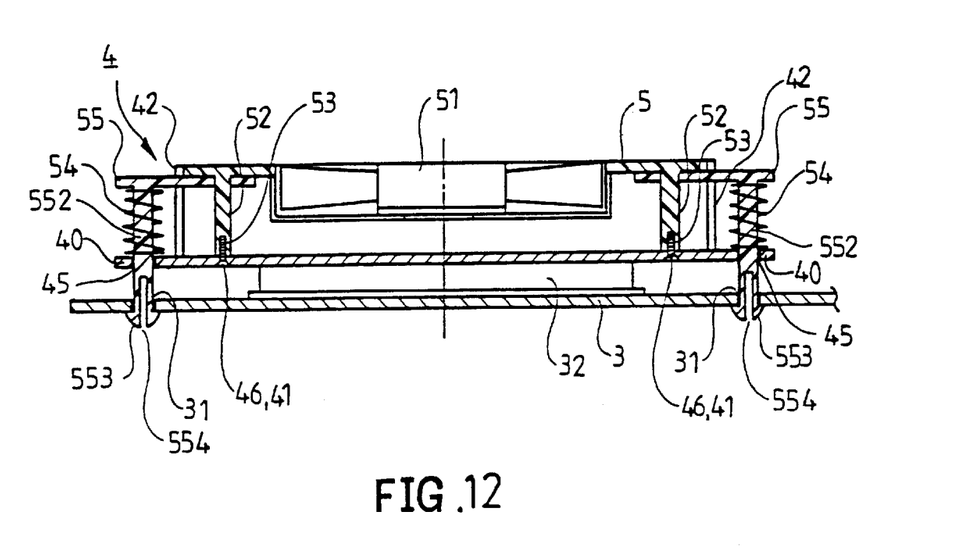
FIG. 12 is a sectional view of the heat-dissipating device, the circuit board, and the mounting device in FIG. 11.

FIGS. 11 and 12 illustrate a sixth embodiment of the invention, wherein the base 4 includes a number of outwardly extending positioning tab 40 each having a positioning hole 45 through which an engaging peg 552 of an associated engaging member 55 is extended. The snap fastener 553 of each engaging peg 552 is retained on the other side of the associated positioning hole 31 of the circuit board 3. Thus, the heat-dissipating device is easily and securely engaged with the heat-generating element in an intimate contact manner.

Figure 13:
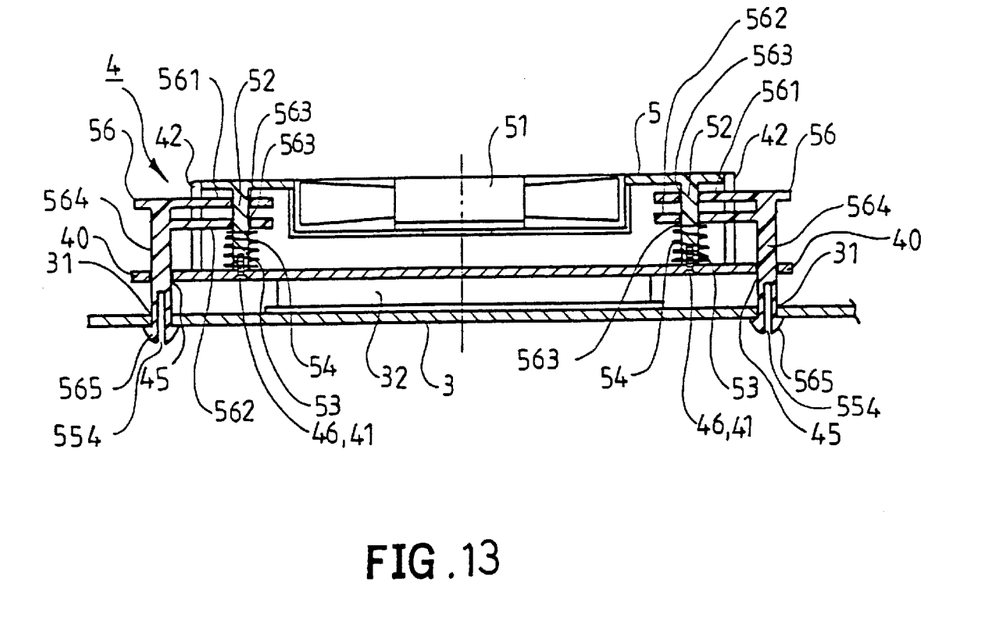
FIG. 13 is a sectional view similar to FIG. 12, illustrating a seventh embodiment of the mounting device in accordance with the present invention.

FIG. 13 illustrates a seventh embodiment of the invention, wherein the engaging member (now designated by 56) includes two horizontally extending upper and lower plates 561 and 562. Each plate 561, 562 has a positioning hole 563 through which an associated post 52 extends. Provision of the upper and lower plates 561 and 562 provide more reliable engagement between the post 52 and the engaging member 56.

According to the above description, it is appreciated that the heat-dissipating device and the heat-generating element can be easily secured together by the mounting device in accordance with the present invention. The base of the heat-dissipating device is in intimate contact with the heat-generating element to obtain optimal heat-dissipating effect. The height of the heat-dissipating device is relatively low after the heat-dissipating device and the heat-generating element are engaged together.

Although the invention has been explained in relation to its preferred embodiment as mentioned above, it is to be understood that many other possible modifications and variations can be made without departing from the spirit and scope of the invention. It is, therefore, contemplated that the appended claims will cover such modifications and variations that fall within the true scope of the invention.

What is claimed is:

1. A combination of a circuit board and a heat-dissipating device, comprising:
    a circuit board including a heat-generating element mounted thereon and a plurality of first positioning holes; and
    a heat-dissipating device including a base made of thermal conductive material and a cover plate, the base including an underside in intimate contact with the heat-generating element, the base further including a plurality of second positioning holes aligned with the first positioning holes, respectively, the base further including a plurality of fins, the cover plate including a plurality of posts, each said post including a snap fastener formed on a distal end thereof, each said post being extended through an associated said second positioning hole of the base and an associated said first positioning hole of the circuit board and retained on an underside of the circuit board.

2. The combination of a circuit board and a heat-dissipating device as claimed in claim 1, wherein each said snap fastener includes a slit to provide the snap fastener with resiliency such that the snap fastener is capable of being compressed and then expanded.

3. The combination of a circuit board and a heat-dissipating device as claimed in claim 1, wherein each said post includes an elastic element sleeved therearound.

4. The combination of a circuit board and a heat-dissipating device as claimed in claim 1, wherein the fins are formed along four sides of the base, and wherein the fins formed on two opposite sides of the four sides of the base are lower than the fins formed on the other two opposite sides of the four sides of the base, the cover plate being resting on tops of the fins that are relatively lower, and two opposite sides of the cover plate being held between the fins that are relatively higher.

5. The combination of a circuit board and a heat-dissipating device as claimed in claim 1, wherein the cover plate includes a fan impeller pivotally mounted thereon.

6. A heat-dissipating device for a heat-generating element comprising:
    a base made of thermal conductive material and including a plurality of fins; and
    a cover plate including a plurality of posts, each said post including a snap fastener formed on a distal end thereof, each said snap fastener having resiliency such that the snap fastener is capable of being compressed and then expanded, wherein the base includes a plurality of positioning holes through which the posts of the cover plate extend respectively.

7. The heat-dissipating device as claimed in claim 6, wherein each said post includes an elastic element mounted therearound.

8. The heat-dissipating device as claimed in claim 6, wherein the fins are formed along four sides of the base, and wherein the fins formed on two opposite sides of the four sides of the base are lower than the fins formed on the other two opposite sides of the four sides of the base, the cover plate being resting on tops of the fins that are relatively lower, and two opposite sides of the cover plate being held between the fins that are relatively higher.

9. The heat-dissipating device as claimed in claim 6, wherein the cover plate includes a fan impeller pivotally mounted thereon.

* * * * *